United States Patent
Yan et al.

(10) Patent No.: US 11,107,864 B2
(45) Date of Patent: Aug. 31, 2021

(54) ORGANIC LIGHT-EMITTING DIODE DISPLAY SUBSTRATE, METHOD OF PREPARING THE SAME, AND DISPLAY DEVICE

(71) Applicant: BOE Technology Group Co., Ltd., Beijing (CN)

(72) Inventors: Guang Yan, Beijing (CN); Changyen Wu, Beijing (CN); Juanjuan You, Beijing (CN); Linlin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/546,968

(22) Filed: Aug. 21, 2019

(65) Prior Publication Data

US 2020/0176516 A1     Jun. 4, 2020

(30) Foreign Application Priority Data

Nov. 29, 2018 (CN) .......................... 201811442151.7

(51) Int. Cl.
   *H01L 27/32*     (2006.01)
   *H01L 51/56*     (2006.01)
   *H01L 51/52*     (2006.01)

(52) U.S. Cl.
CPC ........ *H01L 27/322* (2013.01); *H01L 27/3244* (2013.01); *H01L 51/5268* (2013.01); *H01L 51/56* (2013.01)

(58) Field of Classification Search
CPC ... H01L 27/322; H01L 51/56; H01L 27/3244; H01L 2251/5369; H01L 51/5036; H01L 51/5016

See application file for complete search history.

(56) References Cited

U.S. PATENT DOCUMENTS 8,098,009 B2 *   1/2012   Ito ..................... G02F 1/133617
                                                                           313/506
2015/0048348 A1    2/2015   Huang et al.
(Continued)

FOREIGN PATENT DOCUMENTS

CN      103236435 A     8/2013
CN      103700785 A     4/2014
(Continued)

OTHER PUBLICATIONS

Office Action of CN Application No. 201811442151.7 and English translation, dated Mar. 20, 2020, 20 pages.
(Continued)

*Primary Examiner* — Thanh Y. Tran (74) *Attorney, Agent, or Firm* — Muncy, Geissler, Olds & Lowe, P.C.

(57) ABSTRACT

The present disclosure provides an organic light-emitting diode display substrate, a method of preparing the same, and a display device. The organic light-emitting diode display substrate includes: a light-emitting layer, a light modulation layer, and a color conversion layer, in which the light-emitting layer is configured to emit first color light, the light modulation layer and the color conversion layer are arranged on different light-exiting paths of the light-emitting layer, the color conversion layer is configured to convert first color light into second color light and third color light, and the light modulation layer is configured to modulate an emergent direction of first color light.

18 Claims, 3 Drawing Sheets

(56) References Cited

U.S. PATENT DOCUMENTS

| | | |
|---|---|---|
| 2015/0138506 A1 | 11/2015 | Zhou et al. |
| 2016/0276613 A1 | 9/2016 | Gu et al. |
| 2017/0076678 A1 | 3/2017 | Lee et al. |
| 2017/0176834 A1* | 6/2017 | Kim .......................... G02F 1/29 |
| 2018/0006093 A1 | 1/2018 | Kim et al. |
| 2018/0088404 A1 | 3/2018 | Chae et al. |
| 2019/0018287 A1 | 1/2019 | Lüchinger et al. |
| 2019/0339574 A1* | 11/2019 | Lin ................... G02F 1/133617 |
| 2020/0133077 A1* | 4/2020 | Lin ................... G02F 1/133512 |
| 2020/0227484 A1* | 7/2020 | Lin ................... G02F 1/133617 |

FOREIGN PATENT DOCUMENTS

| | | |
|---|---|---|
| CN | 104143564 A | 11/2014 |
| CN | 106526947 A | 3/2017 |
| CN | 107544174 A | 1/2018 |
| CN | 108604428 A | 9/2018 |

OTHER PUBLICATIONS

Chung, Yoonsung; "[Display Dynamics] Why are QLEDs drawing attention?"; Sep. 27, 2016, pp. 1-3; retrieved from internet Nov. 13, 2019 https://technology.ihs.com/583974/why-are-qleds-drawing-attention.

* cited by examiner

ORGANIC LIGHT-EMITTING DIODE DISPLAY SUBSTRATE, METHOD OF PREPARING THE SAME, AND DISPLAY DEVICE

CROSS-REFERENCE TO RELATED APPLICATION

This application claims a priority to Chinese Patent Application No. 201811442151.7 filed on Nov. 29, 2018, the disclosures of which are incorporated in their entirety by reference herein.

TECHNICAL FIELD

The present disclosure relates to the field of display technology, in particular, to an organic light-emitting diode display substrate, a method of preparing the same, and a display device.

BACKGROUND

An organic light-emitting diode (OLED) is an active light-emitting display device with advantages of self-illumination, wide viewing angle, high contrast, low power consumption, high reaction speed, etc. At present, as for small-sized OLED products, an organic electroluminescent layer is usually formed by an evaporation process, and low power consumption and high color gamut are achieved by using the modulation of the optical resonator. However, due to the high cost of the preparation materials and the need of using a fine metal mask (FMM) in the preparation process, this method cannot achieve stable mass production of large-sized OLED products.

The mass production of large-size OLED products mainly uses a method of white OLED plus color filter, but this method has the problem of large power consumption and insufficient color gamut. In order to solve the problem of power consumption and color gamut, the related art proposes a manner of blue OLED plus green and red quantum dot color conversion layers. According to the study by the inventor of the present disclosure, this method has the problems of poor viewing angle characteristics and viewing angle color shift, which greatly affect the display quality.

SUMMARY

An embodiment of the present disclosure provides an organic light-emitting diode display substrate, including a light-emitting layer, a light modulation layer, and a color conversion layer, in which the light-emitting layer is configured to emit first color light, the light modulation layer and the color conversion layer are arranged on different light-exiting paths of the light-emitting layer, the color conversion layer is configured to convert first color light into second color light and third color light, and the light modulation layer is configured to modulate an emergent direction of first color light.

In an example, the light-emitting layer includes a first light-emitting unit, a second light-emitting unit, and a third light-emitting unit that are periodically arranged on a driving substrate and emit first color light, the light modulation layer includes a first light modulation unit and/or a second light modulation unit that is arranged on a light-exiting path of the first light-emitting unit and modulates the emergent direction of first color light, and the color conversion layer includes a second color conversion unit that is arranged on a light-exiting path of the second light-emitting unit and converts first color light into second color light and a third color conversion unit that is arranged on a light-exiting path of the third light-emitting unit and converts first color light into third color light.

In an example, the first light modulation unit, the second color conversion unit, and the third color conversion unit are arranged on a protective layer covering the light-emitting layer or arranged on a cover plate, in which an orthogonal projection of the first light modulation unit on the driving substrate at least partially overlaps with an orthogonal projection of the first light-emitting unit on the driving substrate, an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate.

In an example, the second color conversion unit and the third color conversion unit are arranged on a protective layer covering the light-emitting layer or arranged on a cover plate, in which an orthogonal projection of the second color conversion unit on the driving substrate at least partially overlaps with an orthogonal projection of the second light-emitting unit on the driving substrate, an orthogonal projection of the third color conversion unit on the driving substrate at least partially overlaps with an orthogonal projection of the third light-emitting unit on the driving substrate, the second light modulation unit is arranged on an overcoat covering the second color conversion unit and the third color conversion unit, and an orthogonal projection of the second light modulation unit on the driving substrate at least partially overlaps with an orthogonal projection of the first light-emitting unit on the driving substrate.

In an example, the organic light-emitting diode display substrate further includes a second filter unit and a third filter unit arranged on light-exiting paths of the second color conversion unit and the third color conversion unit, respectively.

In an example, the first light modulation unit is a single layer structure including a matrix layer and microparticles distributed in the matrix layer, a refractive index of the matrix layer being different from a refractive index of the microparticles, or the first light modulation unit is a laminated structure including 2 to 5 modulation layers that are stacked sequentially, each of the modulation layers including a matrix layer and microparticles distributed in the matrix layer, a refractive index of the matrix layer being different from a refractive index of the microparticles.

In an example, the matrix layer has a thickness of 1 μm to 50 μm, the microparticles have an equivalent diameter of 0.025 μm to 5 μm, and a volume ratio of the microparticles to the matrix layer is 1:20 to 1:1.25.

In an example, the first light-emitting unit, the second light-emitting unit, and the third light-emitting unit each include a first electrode, an organic material functional layer, and a second electrode, one of the first electrode and the second electrode is a reflective electrode and the other is a transflective electrode, and the organic material functional layers of the first light-emitting unit, the second light-emitting unit, and the third light-emitting unit are an integrated structure.

In an example, the reflective electrode includes a reflective layer and a transmissive layer that are stacked, a material of the transflective electrode includes an elementary substance of a metal element or an alloy thereof, and a thickness of the transflective electrode is 8 nm to 20 nm.

An embodiment of the present disclosure also provides a display device including the above-mentioned organic light-emitting diode display substrate.

An embodiment of the present disclosure further provides a method of preparing an organic light-emitting diode display substrate, including: forming a light-emitting layer for emitting first color light; and forming a light modulation layer and a color conversion layer on different light-exiting paths of the light-emitting layer, in which the color conversion layer is configured to convert first color light into second color light and third color light, and the light modulation layer is configured to modulate an emergent direction of first color light.

In an example, the forming the light-emitting layer for emitting first color light includes: forming a first light-emitting unit, a second light-emitting unit, and a third light-emitting unit that are periodically arranged on a driving substrate and emit first color light; the forming the light modulation layer and the color conversion layer includes: forming a protective layer on the light-emitting layer; forming a first light modulation unit, a second color conversion unit, and a third color conversion unit on the protective layer, in which an orthogonal projection of the first light modulation unit on the driving substrate at least partially overlaps with an orthogonal projection of the first light-emitting unit on the driving substrate, an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate.

In an example, the forming the light-emitting layer for emitting first color light includes: forming a first light-emitting unit, a second light-emitting unit, and a third light-emitting unit that are periodically arranged on a driving substrate and emit first color light; the forming the light modulation layer and the color conversion layer includes: forming a protective layer on the light-emitting layer; forming a second color conversion unit and a third color conversion unit on the protective layer, in which an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate; forming an overcoat covering the second color conversion unit and the third color conversion unit; and forming a second light modulation unit on the overcoat, in which an orthogonal projection of the second light modulation unit on the driving substrate at least partially overlaps with an orthogonal projection of the first light-emitting unit on the driving substrate.

In an example, the forming the light-emitting layer for emitting first color light includes: forming a first light-emitting unit, a second light-emitting unit, and a third light-emitting unit that are periodically arranged on a driving substrate and emit first color light to form the light-emitting substrate; the forming the light modulation layer and the color conversion layer includes: forming a light modulation layer and a color conversion layer on a cover plate to form a light processing substrate; and oppositely arranging the light-emitting substrate and the light processing substrate.

In an example, the first light modulation unit is a single layer structure including a matrix layer and microparticles distributed in the matrix layer, a refractive index of the matrix layer being different from a refractive index of the microparticles, or the first light modulation unit is a laminated structure including 2 to 5 modulation layers that are stacked sequentially, each of the modulation layers including a matrix layer and microparticles distributed in the matrix layer, a refractive index of the matrix layer being different from a refractive index of the microparticles; the matrix layer has a thickness of 1 μm to 50 μm, the microparticles have an equivalent diameter of 0.025 μm to 5 μm, and a volume ratio of the microparticles to the matrix layer is 1:20 to 1:1.25.

Of course, the implementation of any of the products or methods of the present disclosure does not necessarily achieve all of the above-mentioned advantages at the same time. Other features and advantages of the present disclosure will be set forth in the embodiments of the specification which follows, and some will be obvious from the embodiments of specification, or learned by implementing embodiments of the present disclosure. The objectives and other advantages of the present disclosure can be realized and obtained by the structure particularly set forth in specification, drawings, and claims.

BRIEF DESCRIPTION OF THE DRAWINGS

The drawings described herein are intended to provide a further understanding of the technical solutions of the present disclosure, and constitute a part of this disclosure. They together with the embodiments of the present disclosure are intended to illustrate the technical solutions of the present disclosure, and do not constitute a limitation of the technical solutions of the present disclosure. The shapes and sizes of the various components in the drawings do not reflect true proportions, but are merely intended to illustrate the present disclosure.

DETAILED DESCRIPTION

The detailed description of the present disclosure will be further described in detail below with reference to the drawings and examples. The following examples are used to illustrate the disclosure, but are not intended to limit the scope of the disclosure. It should be noted that the embodiments in the disclosure and the features in the embodiments can be arbitrarily combined with each other, as long as they contradict each other.

In the technical solution of blue OLED plus green and red quantum dots proposed by the related art, the light-emitting unit generally uses a structure having a strong optical resonator function, and thus the emitted blue light has an emission spectrum with narrow half-wave width. Such structural design in the related art, on one hand, is to increase the emission intensity to reduce display power consumption and improve color purity; and on the other hand, is to concentrate the blue light spectrum in a specific red quantum dot/green quantum dot excitation wavelength range, so as to improve red light/green light conversion efficiency and light intensity, thereby reducing display power consumption. From the perspective of reducing the display power consumption, such a structure having the strong optical resonator function is necessary. According to the study by the inventors of the present disclosure, it is precisely because the light-emitting unit uses the structure having the strong optical resonator function, the structure has a problem of poor viewing angle characteristics and viewing angle color shift. Specifically, the green light emitted by the green sub-pixel is the light converted from blue light absorbed by the green quantum dot color conversion layer, and the red light emitted by the red sub-pixel is the light converted from blue light absorbed by the red quantum dot color conversion layer. Therefore, the viewing angle characteristics of the green light emitted by the green sub-pixel and the red light emitted by the red sub-pixel conform to the conventional Lambert reflector. Lambert reflector refers to the phenomenon that the incident light is uniformly reflected in all directions, that is, the phenomenon that the incident light is centered on the incident point and isotropically reflects in the entire hemispherical space, which is called diffuse reflection, and also called isotropic reflection. However, the blue light emitted by the blue sub-pixel is still the blue light emitted by the light-emitting unit. Since the light-emitting unit has the structure with the strong optical resonator function, the blue light emitted by the blue sub-pixel is optically modulated intensively, and the viewing angle characteristics thereof are completely inconsistent with the conventional Lambert reflector, and the light emitted by the blue sub-pixel has poor viewing angle characteristics. Since the viewing angle characteristics of the red sub-pixel, the green sub-pixel, and the blue sub-pixel are different, on one hand, the viewing angle characteristic of the overall display is reduced, and on the other hand, the problem of the viewing angle color shift appears, which affects the viewing angle characteristics of the white light, thereby affecting the display quality.

Table 1 shows the viewing angle characteristics of RGBW in the related technical solution. In Table 1, R represents red light, G represents green light, B represents blue light, W represents white light, Brightness represents brightness, CIEx and CIEy represent CIE color space coordinates, and Δu'v' represents color shift. As shown in Table 1, it is assumed that the brightness of the viewing angle of 0° is 100%. At the viewing angle of 15°, the brightness of the blue light starts to be lower than the brightness of the green light and the red light, and at the viewing angles of 45° and 60°, the brightness of the blue light is significantly lower than the brightness of the green light and the red light. At the same time, from the viewing angle of 45°, the color shift of blue light and the white light is significantly increased. As can be seen, in the related technical solution of blue OLED plus green and red quantum dots, as the viewing angle increases, the viewing angle characteristics of the blue light becomes worse and the color shift increases.

TABLE 1 the viewing angle characteristics of RGBW in the related technical solution.

| Viewing Angle | R | | | | G | | | |
|---|---|---|---|---|---|---|---|---|
| | Brightness | CIEx | CIEy | Δu'v' | Brightness | CIEx | CIEy | Δu'v' |
| 0° | 100% | 0.680 | 0.301 | 0.000 | 100% | 0.223 | 0.666 | 0.000 |
| 15° | 96% | 0.680 | 0.301 | 0.001 | 96% | 0.222 | 0.665 | 0.000 |
| 30° | 85% | 0.678 | 0.302 | 0.004 | 83% | 0.220 | 0.661 | 0.002 |
| 45° | 67% | 0.675 | 0.303 | 0.008 | 63% | 0.218 | 0.652 | 0.004 |
| 60° | 44% | 0.671 | 0.304 | 0.012 | 41% | 0.217 | 0.641 | 0.006 |

| Viewing Angle | B | | | | W | | | |
|---|---|---|---|---|---|---|---|---|
| | Brightness | CIEx | CIEy | Δu'v' | Brightness | CIEx | CIEy | Δu'v' |
| 0° | 100% | 0.140 | 0.048 | 0.000 | 100% | 0.281 | 0.288 | 0.000 |
| 15° | 91% | 0.142 | 0.046 | 0.005 | 95% | 0.283 | 0.289 | 0.002 |
| 30° | 67% | 0.145 | 0.048 | 0.006 | 82% | 0.297 | 0.310 | 0.016 |
| 45° | 45% | 0.145 | 0.059 | 0.025 | 63% | 0.319 | 0.350 | 0.040 |
| 60° | 35% | 0.144 | 0.074 | 0.060 | 41% | 0.323 | 0.359 | 0.044 |

To solve the problems of poor viewing angle characteristics and viewing angle color shift presented in the related technical solution of blue OLED plus green and red quantum dot conversion layers, the present disclosure provides an OLED display substrate, a method of preparing the same, and a display device.

The OLED display substrate of the embodiment of the present disclosure includes a light-emitting layer, a light modulation layer, and a color conversion layer, in which the light-emitting layer is configured to emit first color light, the light modulation layer and the color conversion layer are arranged on different light-exiting paths of the light-emitting layer, the color conversion layer is configured to convert first color light into second color light and third color light, and the light modulation layer is configured to modulate an emergent direction of first color light. Specifically, the light-emitting layer includes a first light-emitting unit, a second light-emitting unit, and a third light-emitting unit that are periodically arranged on a driving substrate and emit first color light. The light modulation layer includes a first light modulation unit and/or a second light modulation unit that are arranged on a light-exiting path of the first light-emitting unit and modulate the emergent direction of first color light. The color conversion layer includes a second color conversion unit that is arranged on a light-exiting path of the second light-emitting unit and converts first color light into second color light and a third color conversion unit that is arranged on a light-exiting path of the third light-emitting unit and converts first color light into third color light.

An embodiment of the present disclosure provides an OLED display substrate, in which a light modulation layer is configured to modulate an emergent direction of first color light by arranging the light modulation layer on the light-exiting path of the light-emitting layer, thereby effectively improving the viewing angle characteristic, eliminating the viewing angle color shift, and improving the display quality.

The technical solutions of the embodiments of the present disclosure will be described in detail below by means of specific embodiments.

Figure 1:
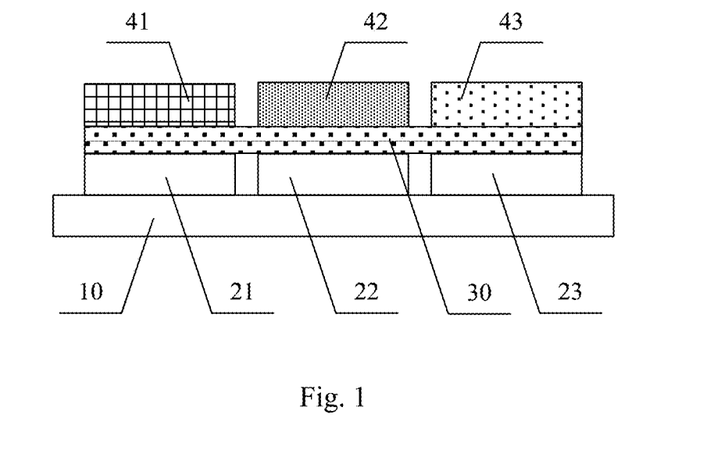
FIG. 1 is a schematic view showing an OLED display substrate according to an embodiment of the present disclosure.

FIG. 1 is a schematic view showing an OLED display substrate according to an embodiment of the present disclosure, which is a top-emitting OLED. As shown in FIG. 1, the OLED display substrate includes: a driving substrate 10; a first light-emitting unit 21, a second light-emitting unit 22, and a third light-emitting unit 23 that are periodically arranged on a driving substrate, in which the first light-emitting unit 21, the second light-emitting unit 22 and the third light-emitting unit 23 as a light-emitting layer are capable of emitting first color light under the driving of the driving substrate 10; a protective layer 30 arranged on the first light-emitting unit 21, the second light-emitting unit 22, and the third light-emitting unit 23; a first light modulation unit 41, a second color conversion unit 42, and a third color conversion unit 43 arranged on the protective layer 30, in which the first light modulation unit 41 serves as a light modulating layer, and its position corresponds to the first light-emitting unit 21 to modulate the direction of first color light; the second color conversion unit 42 and the third color conversion unit 43 serve as a color conversion layer, and the position of the second color conversion unit 42 corresponds to the second light-emitting unit 22 to convert first color light emitted by the second light-emitting unit 22 into second color light, and the position of the third color conversion unit 43 corresponds to the third light-emitting unit 23 to convert first color light emitted by the third light-emitting unit 23 into third color light.

In this embodiment, the structure of the driving substrate 10 is the same as that of the related art, and includes a plurality of pixel units arranged in a matrix manner, each of the plurality of pixel unit including three sub-pixels. The three light-emitting units are arranged in the light-emitting regions formed in the pixel definition layer of the three sub-pixels, respectively. Each of the plurality of the sub-pixels includes a thin film transistor that drives the light-emitting unit to emit light, and the thin film transistor includes an active layer, a gate insulating layer, a gate electrode, an interlayer insulating layer, a source electrode and a drain electrode, which are not described herein again. Each of the light-emitting units includes a first electrode, an organic material functional layer and a second electrode, in which the organic material functional layer is arranged between the first electrode and the second electrode, and the organic material functional layer includes an organic light-emitting layer capable of emitting a first color light under the driving by an electric field between the first electrode and the second electrode. For the top-emitting structure of OLED, the first electrode is a reflective electrode, the second electrode is a transmissive electrode or a transflective electrode; and for the bottom-emitting structure of OLED, the first electrode is a transmissive electrode or a transflective electrode, and the second electrode is a reflective electrode. In actual implementation, the organic material functional layer includes, in addition to the organic light-emitting layer, an electron transport layer and a hole transport layer. Further, in order to improve the efficiency of the electron and hole injection into the light-emitting layer, the organic material functional layer may further include an electron injection layer arranged between the cathode and the electron transport layer, and a hole injection layer arranged between the anode and the hole transport layer.

Figure 2:
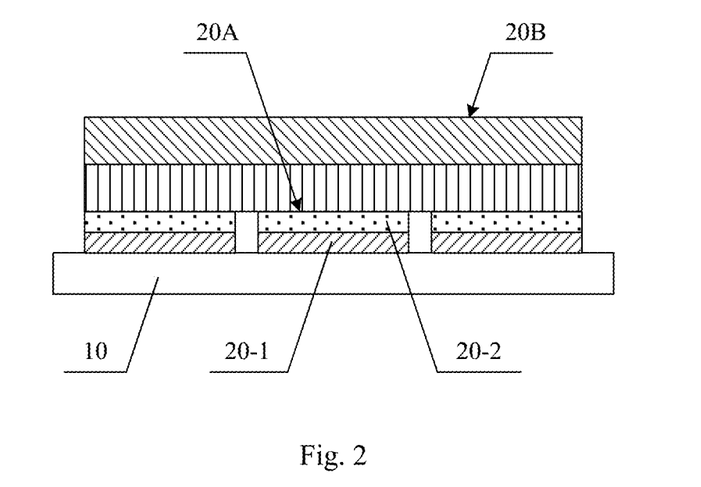
FIG. 2 is a schematic view showing each of the light-emitting units in FIG. 1.

FIG. 2 is a schematic view showing the light-emitting units of FIG. 1. Since the three light-emitting units all emit first color light, the organic material functional layers of the three light-emitting units may adopt an integrated structure, and the second electrode of the three light-emitting units may also adopt an integrated structure. In this embodiment, the organic material functional layer adopts an evaporation process by setting the organic material functional layer of an integrated structure, and the FMM is not needed, thereby reducing the cost and simplifying the process. As shown in FIG. 2, for the top-emitting OLED in this embodiment, the first electrode 20A adjacent to the driving substrate 10 is a reflective electrode, and the second electrode 20B away from the driving substrate 10 is a transflective electrode, thereby realizing a light-emitting unit having a structure of strong optical resonator function, such that the emitted first color light may have a narrower half-wave emission spectrum. The first electrode 20A as a reflective electrode includes a stacked reflective layer 20-1 and a transmissive layer 20-2, the reflective layer 20-1 is arranged on the driving substrate 10, and the transmissive layer 20-2 is arranged on the reflective layer, such that the organic material functional layer is formed on the transmissive layer 20-2. In actual implementation, the reflective layer may be a metal material layer having a reflectance greater than or equal to 90%, the transmissive layer may be a transparent conductive material layer, the metal material may be an elementary substance or an alloy of a metal element, e.g., chromium (Cr), gold (Au), platinum (Pt), nickel (Ni), copper (Cu), tungsten (W) or silver (Ag), and the transparent conductive material may be indium tin oxide (ITO) or indium zinc oxide (IZO). The material of the second electrode 20B as the transflective electrode may be an elementary substance or an alloy of a metal element, e.g., magnesium, silver or a magnesium-silver alloy; and has a thickness of 8 nm to 20 nm.

Figure 3:
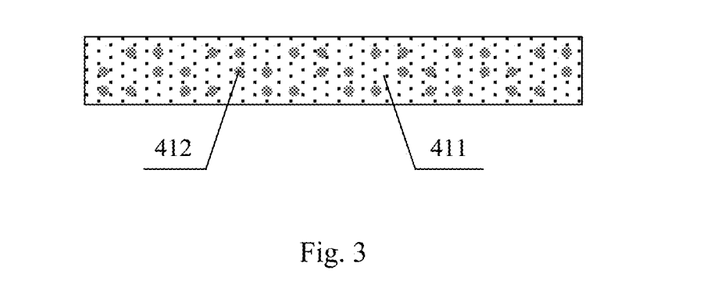
FIG. 3 is a schematic view showing an implementation structure of the first light modulation unit in FIG. 1.

In this embodiment, the first light modulation unit 41 has light scattering characteristics, to modulate the emergent direction by scattering first color light. FIG. 3 is a schematic view showing an implementation structure of the first light modulation unit of FIG. 1. As shown in FIG. 3, as an implementation structure, the first light modulation unit is a single layer structure, including a matrix layer 411 and microparticles 412 distributed in the matrix layer 411. The matrix layer 411 is a transparent material having a low absorbance, and the microparticles 412 are transparent light-scattering particles. The refractive indexes of both the matrix layer 411 and the microparticles 412 are different. The matrix layer 411 has a thickness of 1 μm to 50 μm and may be made of an organic material or an inorganic material, in which the organic material or the inorganic material may be a single compound or a mixture. The microparticles 412 may be in the shape of a sphere, an ellipsoid, a polyhedron or the like, have an equivalent diameter of 0.025 μm to 5 μm, and may be made of an organic material or an inorganic material, in which the organic material or the inorganic material may be a single compound, a mixture, a cavity, or a bubble. The microparticles 412 are uniformly distributed in the matrix layer 411, and the volume ratio of the microparticles 412 to the matrix layer 411 is 1:20 to 1:1.25. In this embodiment, the light scattering characteristics of the first light modulation unit 41 is realized by using the refractive index difference between the matrix layer 411 and the microparticles 412. Specifically, the light entering the matrix layer 411 is refracted at the interface between the matrix layer 411 and the microparticles 412, the direction of the light is changed, and the light is emitted in multiple directions, so that the viewing angle characteristics of the emitted light conforms to the conventional Lambert reflector, thereby improving the viewing angle characteristics.

Figure 4:
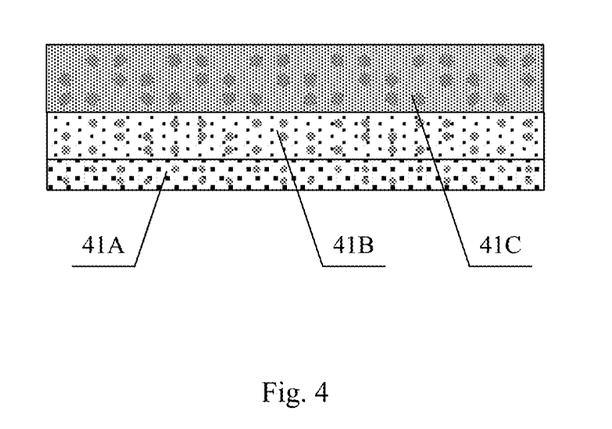
FIG. 4 is a schematic view showing another implementation structure of the first light modulation unit in FIG. 1.

FIG. 4 is a schematic view showing another implementation structure of the first light modulation unit in FIG. 1. As another implementation structure, the first light modulation unit is a laminated structure including a plurality of modulation layers that are stacked sequentially, and each of the modulation layers includes a matrix layer 411 and microparticles distributed in the matrix layer. In actual implementation, the laminated structure may include 2 to 5 modulation layers, for example, the laminated structure may include 3 to 4 modulation layers. As shown in FIG. 4, the first light modulation unit includes a first modulation layer 41A, a second modulation layer 41B, and a third modulation layer 41C that are stacked sequentially, and is capable of realizing the design of the viewing angle characteristics. The viewing angle characteristic of first color light emitted by the first light modulation unit is designed to be the same as or similar to the viewing angle characteristics of second color light and third color light emitted respectively by the second color conversion unit and the third color conversion unit, thereby eliminating the viewing angle color shift. For example, the thickness of the second modulation layer 41B may be set to be greater than or equal to the thickness of the first modulation layer 41A and less than or equal to the thickness of the third modulation layer 41C; the concentration of the second modulation layer 41B may be set to be less than or equal to the concentration of the third modulation layer 41C (the ratio of the volume of the microparticles to the volume of the matrix layer) and greater than or equal to the concentration of the first modulation layer 41A; and the diameter of the microparticles in the second modulation layer 41B may be set to be less than or equal to the diameter of the microparticles in the third modulation layer 41C and greater than or equal to the diameter of the microparticles in the first modulation layer 41A. For example, the difference in refractive indexes between the matrix layer and the microparticles in the second modulation layer 41B may be set to be less than or equal to the difference in refractive indexes between the matrix layer and the microparticles in the first modulation layer 41A and greater than or equal to the difference in refractive indexes between the matrix layer and the microparticles in the third modulation layer 41C. As another example, the shape of the microparticles in the three modulation layers may be set to be different. In actual implementation, the number of layers of the modulation layer in the first light modulation unit, the material and thickness of each modulation layer, the material and diameter of the microparticles in the matrix layer and the volume ratio of the microparticles to the matrix layer can be designed according to the actual viewing angle characteristics; and the design of the viewing angle characteristics can be realized by the existing mature optical path design algorithm, which will not be described herein. Further, the first light modulation unit of this embodiment can be prepared by coating, deposition lithography, etc., which are well known to one skilled in the art. For example, the preparing the first light modulation unit by coating manner includes: mixing a granule, a dispersing agent and a solvent to prepare a solution, mixing the solution with the photoresist, and then spin-coating mixed solution into a film by a conventional process.

In this embodiment, the second color conversion unit 42 and the third color conversion unit 43 may employ a quantum dot conversion layer. Quantum dots (QDs), also known as nanocrystals, are nanoparticles composed of Group II-VI or Group III-V elements. The particle size of quantum dots is generally between 1 nm and 20 nm. Since electrons and holes are quantum confined, a continuous band structure becomes a discrete energy level structure having molecular properties, and can emit fluorescence after being excited. The emission spectrum of the quantum dots can be controlled by changing the size of the quantum dots, and its emission spectrum can cover the entire visible region by changing the size and the chemical composition of the quantum dots. The material of the quantum dots may be at least one of zinc oxide, graphene, cadmium selenide (CdSe), cadmium sulfide (CdS), cadmium telluride (CdTe), zinc selenide (ZnSe), zinc telluride (ZnTe), or zinc sulfide (ZnS). Taking CdTe quantum dots as an example, when its particle size is grown from 2.5 nm to 4.0 nm, the emission wavelength can be redshifted from 510 nm to 660 nm. In this embodiment, the quantum dot conversion layer of the second color conversion unit 42 includes a transparent material layer doped with second color quantum dots. After first color light from the second light-emitting unit 22 is incident on the second color conversion unit 42, the second color quantum dot is excited by first color light to emit second color light, thereby converting first color light into second color light. The quantum dot conversion layer of the third color conversion unit 43 includes a transparent material layer doped with third color quantum dots. After first color light from the third light-emitting unit 23 is incident on the third color conversion unit 43, the third color quantum dot is excited by first color light to emit third color light, thereby converting first color light into third color light. In actual implementation, the second color conversion unit 42 and the third color conversion unit 43 may also use a quantum rod conversion layer, or light color conversion layer in other forms, in which the conversion principle of the quantum rod conversion layer is similar to the quantum dot conversion layer. The material of the light color conversion layer may be 4-(dicyanomethylene)-2-methyl-6-(p-dimethylaminostyryl)-4H-pyran (DCM-1), DCM-2, cyanine dyes such as DCJTB, 4,4-difluoro-1,3,5,7-tetraphenyl-4-boran-3a,4a-diaza-s-indacene, Lumogen red and Nile red. The quantum dot conversion layer, the quantum rod conversion layer or the light color conversion layer used in this embodiment adopts the existing mature technology, whose composition, structure and preparation are well known to one skilled in the art and will not be described herein.

In actual implementation, first color light may be blue light, green light or red light; second color light may be a color light different from first color light; and third color light may be a color light different from first color light and the second color. They can be designed according to actual needs. Given that the energy of the blue light is higher than the energy of red light and green light, it is easier to convert the high-energy blue light into the low-energy green light or the red light. Therefore, in this embodiment, the first light-emitting unit 21, the second light-emitting unit 22 and the third light-emitting unit 23 are a blue light-emitting unit, a green light-emitting unit and a red light-emitting unit, respectively. That is, first color light is blue light; the second color conversion unit 42 is a conversion unit that converts blue light into green light, i.e., second color light is green light; and the third color conversion unit 43 is a conversion unit that converts blue light into red light, i.e., third color light is red light.

Figure 5:
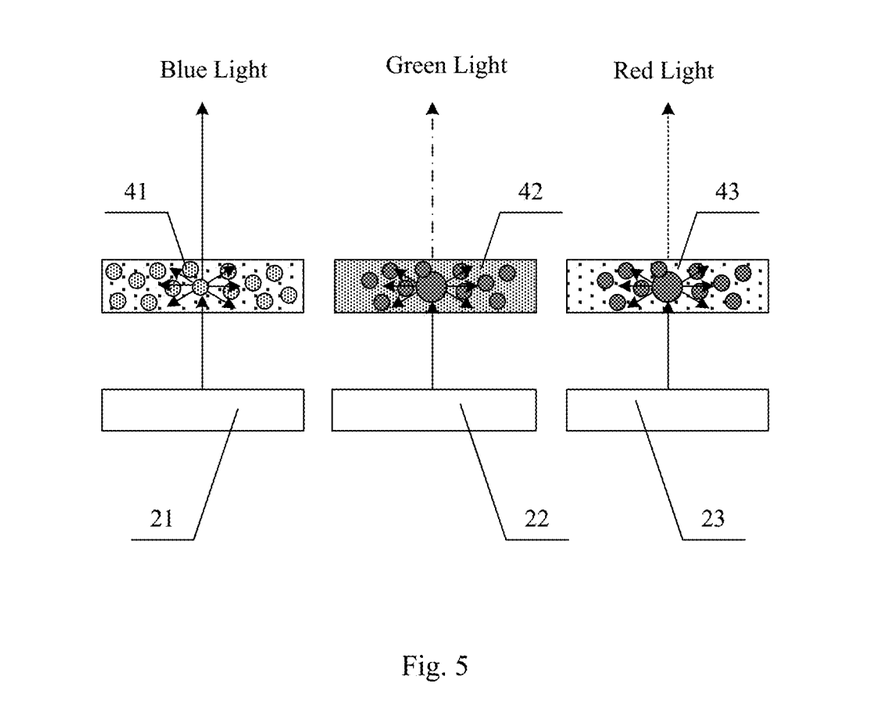
FIG. 5 is a schematic view showing the working principle of the first light modulation unit in FIG. 1.

FIG. 5 is a schematic view showing the working principle of the first light modulation unit in FIG. 1. As shown in FIG. 5, the first light-emitting unit 21, the second light-emitting unit 22, and the third light-emitting unit 23 emit blue light, which is indicated by a solid line; the second color conversion unit 42 converts blue light into green light, which is indicated by a dot dash line; and the third color conversion unit 43 converts blue light into red light, which is indicated by a dash line. After the blue light emitted by the first light-emitting unit 21 is incident on the first light modulation unit 41, the blue light is refracted at the interface between the matrix layer and the microparticles, the direction of the light is changed, and the light is emitted in multiple directions, so that the viewing angle characteristics of the emitted light conforms to the conventional Lambert reflector, thereby improving the viewing angle characteristics. After the blue light emitted from the second light-emitting unit 22 is incident on the second color conversion unit 42, the green quantum dots in the second color conversion unit 42 are excited by the blue light to emit green light, and then the green light is emitted from the light-emitting surface (the surface away from the second light-emitting unit 22) of the second color conversion unit 42. Similarly, after the blue light emitted from the third light-emitting unit 23 is incident on the third color conversion unit 43, the red quantum dots in the third color conversion unit 43 are excited by blue light to emit red light, and then the red light is emitted from the light-emitting surface (the surface away from the third light-emitting unit 23) of the third color conversion unit 43.

Although this embodiment has been described with a top-emitting OLED, the solution of this embodiment is equally applicable to a bottom-emitting OLED or a double-side emitting OLED. As can be seen from the above description, the OLED display substrate in this embodiment can be expanded in various ways. For example, according to actual needs, other transmissive layers may be arranged between the light-emitting unit and the protective layer, between the protective layer and the first light modulation unit, and between the protective layer and the color conversion unit.

Tables 2 and 3 show the results of the comparison tests of the brightness of the emitted light between the present embodiment and the related technical solution. In Tables 2 and 3, the meanings of R, G, B, W, Brightness, CIEx, CIEy, and Δu'v' are the same as those in Table 1. Among them, the structure in the related technical solution is different from the structure in the present embodiment in that the first light modulation unit is not arranged in the structure in the related technical solution. As shown in Table 2, in this embodiment, assuming that the brightness of the blue light at the viewing angle of 0° is 100%, the brightness of the blue light at the viewing angle of 30° is 70%, the brightness of the blue light at the viewing angle of 45° is 50%, and the brightness of the blue light at the viewing angle of 60° is 41%. They are all greater than the blue light brightness at the corresponding viewing angle in the related technical solution. In addition, the blue color shift at the viewing angle of 60° is 0.06, and the color shift is reduced by 50% as compared to the related technical solution. As shown in Table 3, in this embodiment, assuming that the white light brightness at the viewing angle of 0° is 100%, the white light brightness at the viewing angle of 60° is 42%. It is larger than the white light brightness at the viewing angle of 60° in the related art, and the color shift is greatly reduced. The result of the comparison test shows that the present embodiment effectively improves the viewing angle characteristics of the blue light and effectively eliminates the problem of the viewing angle color shift.

TABLE 2 the result of the comparison test of the brightness of the emitted blue light between the present embodiment and the related technical solution.

| Viewing Angle | Related Technical Solution | | | | Present Embodiment | | | |
|---|---|---|---|---|---|---|---|---|
| | Brightness | CIEx | CIEy | Δu'v' | Brightness | CIEx | CIEy | Δu'v' |
| 0° | 100% | 0.140 | 0.048 | 0.000 | 100% | 0.141 | 0.048 | 0.000 |
| 15° | 91% | 0.142 | 0.046 | 0.005 | 91% | 0.142 | 0.047 | 0.004 |
| 30° | 67% | 0.145 | 0.048 | 0.006 | 70% | 0.144 | 0.048 | 0.005 |
| 45° | 45% | 0.145 | 0.059 | 0.025 | 50% | 0.144 | 0.057 | 0.021 |
| 60° | 35% | 0.144 | 0.074 | 0.060 | 41% | 0.143 | 0.067 | 0.045 |

TABLE 3 the result of the comparison test of the brightness of the emitted white light between the present embodiment and the related technical solution.

| Viewing Angle | Related Technical Solution | | | | Present Embodiment | | | |
|---|---|---|---|---|---|---|---|---|
| | Brightness | CIEx | CIEy | Δu'v' | Brightness | CIEx | CIEy | Δu'v' |
| 0° | 100% | 0.281 | 0.288 | 0.000 | 100% | 0.281 | 0.288 | 0.000 |
| 15° | 95% | 0.283 | 0.289 | 0.002 | 95% | 0.283 | 0.289 | 0.001 |
| 30° | 82% | 0.297 | 0.310 | 0.016 | 82% | 0.294 | 0.306 | 0.013 |
| 45° | 63% | 0.319 | 0.350 | 0.040 | 63% | 0.310 | 0.335 | 0.032 |
| 60° | 41% | 0.323 | 0.359 | 0.044 | 42% | 0.307 | 0.331 | 0.028 |

Figure 6:
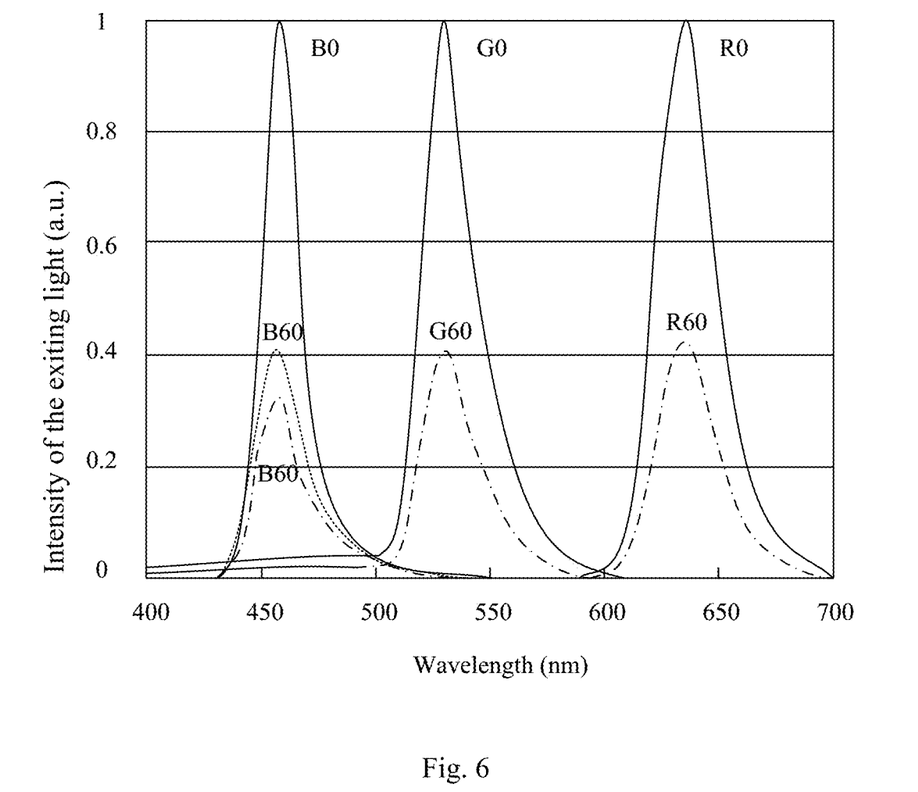
FIG. 6 is a spectrum diagram of the emitted light from the OLED display substrate in FIG. 1 and the related technical solution.

FIG. 6 is a spectrum diagram of the emitted light in FIG. 1 and the related technical solution. Among them, B0, G0, and R0 indicate the intensity of blue light, green light, and red light at a viewing angle of 0°, respectively; and B60, G60, and R60 indicate the intensity of blue light, green light, and red light at a viewing angle of 60°, respectively. The dot dash line is the intensity in the related technical solution, and the dash line is the intensity of the solution in the present embodiment. As shown in FIG. 6, for the blue viewing angle of 0°, the brightness in this embodiment is the same as the brightness in the related art solution. However, for the blue viewing angle of 60°, the brightness in this present embodiment is greater than the brightness in the related technical solution, and the half-wave width is increased. Meanwhile, when the viewing angle is 60°, the brightness and waveforms of the blue light, green light, and red light in the present embodiment are similar. As can be seen, the solution of the present disclosure not only effectively improves the viewing angle characteristics of the blue light, but also effectively eliminates the viewing angle color shift caused by the difference in viewing angles between blue light, green light, and red light.

By providing a first light modulation unit on the light-exiting path of the first light-emitting unit and by modulating the direction of first color light via the first light modulation unit, the present embodiment not only effectively improves the viewing angle characteristics of the light emitted by the sub-pixel where the first light-emitting unit is located, but also may allow the viewing angle characteristics of the light emitted by the sub-pixel where the first light-emitting unit is located to be similar to the viewing angle characteristics of the light emitted by the sub-pixel where the second light-emitting unit is located and the viewing angle characteristics of the light emitted by the sub-pixel where the third light-emitting unit is located, thereby eliminating the difference in viewing angle characteristics between sub-pixels, effectively eliminating the viewing angle color shift, and improving the display quality.

Figure 7:
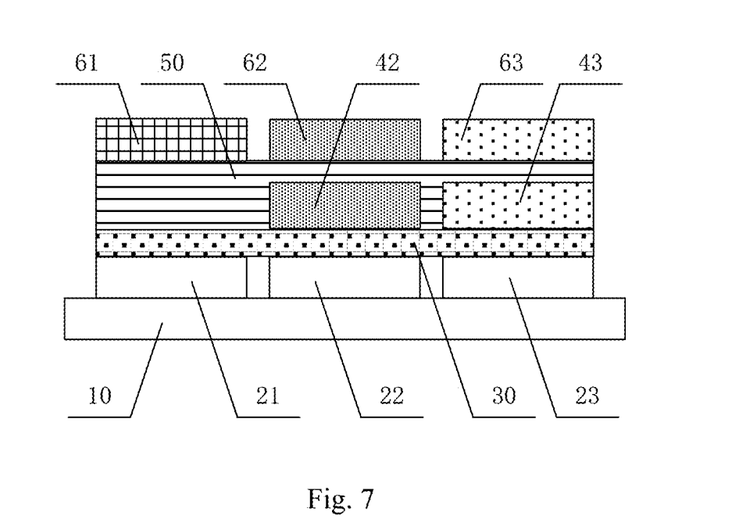
FIG. 7 is a schematic view showing an OLED display substrate according to another embodiment of the present disclosure.

FIG. 7 is a schematic view showing an OLED display substrate according to another embodiment of the present disclosure. As shown in FIG. 7, the OLED display substrate includes: a driving substrate 10; a first light-emitting unit 21, a second light-emitting unit 22, and a third light-emitting unit 23 that are periodically arranged on a driving substrate, in which the first light-emitting unit 21, the second light-emitting unit 22 and the third light-emitting unit 23 are capable of emitting first color light under the driving of the driving substrate 10; a protective layer 30 arranged on the first light-emitting unit 21, the second light-emitting unit 22, and the third light-emitting unit 23; a second color conversion unit 42 and a third color conversion unit 43 arranged on the protective layer 30, in which the position of the second color conversion unit 42 corresponds to the second light-emitting unit 22 to convert first color light emitted by the second light-emitting unit 22 into second color light, and the position of the third color conversion unit 43 corresponds to the third light-emitting unit 23 to convert first color light emitted by the third light-emitting unit 23 into third color light; an overcoat 50 covering the second color conversion unit 42 and the third color conversion unit 43, in which a second light modulation unit 61, a second filter unit 62, and a third filter unit 63 are arranged on the overcoat 50, the position of the second light modulation unit 61 corresponds to the position of the first light-emitting unit 21 and is configured to modulate the direction of first color light, the position of the second filter unit 62 corresponds to the position of the second color conversion unit 42 and is configured to transmit second color light and filter first color light, and the position of the third filter unit 63 corresponds to the position of the third color conversion unit 43 and is configured to transmit third color light and filter first color light.

In this embodiment, the characteristics, structure, and related parameters of the second light modulation unit 61 are the same as those of the first light modulation unit in the foregoing embodiment, which is not described herein again. Unlike the foregoing embodiment in which the first light modulation unit 41 is arranged in the same layer as the second color conversion unit 42 and the third color conversion unit 43, in the present embodiment, the second light modulation unit 61 is arranged in the same layer as the second filter unit 62 and the third filter unit 63, but the technical effects of the foregoing embodiments can also be achieved, the technical effects including effectively improving the viewing angle characteristics of the light emitted by the sub-pixel where the first light-emitting unit is located, effectively eliminating the difference in viewing angle characteristics between the sub-pixels, and thereby eliminating the viewing angle color shift. Meanwhile, given that the technical solution in the foregoing embodiment in which the second color conversion unit 42 and the third color conversion unit 43 fail to completely convert first color light and thus second color light emitted by the second color conversion unit 42 and third color light emitted by the third color conversion unit 43 may contain the unconverted first color light, in this embodiment, the second filter unit 62 and third second filter unit 63 are arranged on the light-exiting paths of the second color conversion unit 42 and the third color conversion unit 43, and the color purity of second color light and third color light can be increased by filtering out the unconverted first color light. In addition, by providing a color filter layer, this embodiment may also effectively reduce the external light incident on the color conversion unit and reduce the interference of the external light.

In this embodiment, the second filter unit and the third filter unit are used as the color filter layer (CF), and may use an organic photoresist material, whose composition, structure and preparation are well known to one skilled in the art and will not be described herein.

In actual implementation, the OLED display substrate in this embodiment can be expanded in various ways. As an extension, the second light modulation unit 61 in this embodiment has not only light scattering characteristic, but also has a characteristic for improving the color purity of first color light. Specifically, the matrix layer of the light modulation unit may use a first color light photoresist material, and microparticles are added to the first color light photoresist material, so as to form an integrated structure having dual functions of light modulation and color filter. The integrated structure serves as not only a modulation layer, but also a filter layer. Thus, it enhances the color purity of first color light while improving the viewing angle characteristics. As another extension, the foregoing embodiment may be combined together. The OLED display substrate is provided with a first light modulation unit and a second light modulation unit simultaneously, in which the first light modulation unit is arranged on the protective layer, and the second light modulation unit is arranged on the overcoat. The positions of the first light modulation unit and the second light modulation unit are both correspond to the first light-emitting unit, and the viewing angle characteristic is further enhanced by the light scattering processing of the two light modulation units.

The foregoing embodiment has been described by taking a light modulation unit and a color conversion unit arranged on a driving substrate as an example. On the basis of the technical solutions of the foregoing embodiment, the OLED display substrate of this embodiment further includes a cover plate. The light-emitting unit is arranged on the driving substrate to form the light-emitting substrate. The light modulation unit and the color conversion unit are arranged on the cover plate to form the light processing substrate. Then, the light-emitting substrate and the light processing substrate are oppositely arranged to form an OLED display substrate. In this embodiment, the light modulation unit and the color conversion unit are arranged on the cover plate, so that it is necessary to consider the influence of the preparing processes of the first light modulation unit, the second light modulation unit, the second color conversion unit and the third color conversion unit on the light-emitting layer, and thus a wide range of materials and process parameters can be selected.

Based on the technical concept of the above-mentioned embodiments, a method of preparing an OLED display substrate is further provided in an embodiment of the present disclosure. The method of preparing an OLED display substrate includes: S1, forming a light-emitting layer for emitting first color light; and S2, forming a light modulation layer and a color conversion layer on different light-exiting paths of the light-emitting layer, in which the color conversion layer is configured to convert first color light into second color light and third color light, and the light modulation layer is configured to modulate an emergent direction of first color light.

In one embodiment, step S1 includes: forming a first light-emitting unit, a second light-emitting unit, and a third light-emitting unit that are periodically arranged on a driving substrate and emit first color light; step S2 includes: forming a protective layer on the light-emitting layer; and forming a first light modulation unit, a second color conversion unit, and a third color conversion unit on the protective layer, in which the position of the first light modulation unit corresponds to the position of the first light-emitting unit position and is configured to modulate the emergent direction of first color light, the position of the second color conversion unit corresponds to the position of the second light-emitting unit position and is configured to convert first color light into second color light, and the position of the third color conversion unit corresponds to the position of the third light-emitting unit position and is configured to convert first color light into third color light.

In another embodiment, step S1 includes: forming a first light-emitting unit, a second light-emitting unit, and a third light-emitting unit that are periodically arranged on a driving substrate and emit first color light; step S2 includes: forming a protective layer on the light-emitting layer; forming a second color conversion unit and a third color conversion unit on the protective layer, in which the position of the second color conversion unit corresponds to the position of the second light-emitting unit, and the position of the third color conversion unit corresponds to the position of the third light-emitting unit; forming an overcoat covering the second color conversion unit and the third color conversion unit; and forming a second light modulation unit on the overcoat, in which the position of the second light modulation unit corresponds to the position of the first light-emitting unit.

In yet another embodiment, step S1 includes: forming a first light-emitting unit, a second light-emitting unit, and a third light-emitting unit that are periodically arranged on a driving substrate and emit first color light, so as to form the light-emitting substrate; step S2 includes: forming a light modulation layer and a color conversion layer on a cover plate, so as to form a light processing substrate.

The method of preparing the OLED display substrate further includes step S3: oppositely arranging the light-emitting substrate and the light processing substrate.

Among them, the first light modulation unit and the second light modulation unit formed are single layer structures including a matrix layer and microparticles distributed in the matrix layer, a refractive index of the matrix layer being different from a refractive index of the microparticles. As an another example, the first light modulation unit and the second light modulation unit are laminated structures including 2 to 5 single-layer structures that are stacked sequentially, each of the single-layer structures including a matrix layer and microparticles distributed in the matrix layer, a refractive index of the matrix layer being different from a refractive index of the microparticles; the matrix layer has a thickness of 1 μm to 50 μm, the microparticles have an equivalent diameter of 0.025 μm to 5 μm, and a volume ratio of the microparticles to the matrix layer is 1:20 to 1:1.25.

The first color light is blue light, and the color conversion layer is a quantum dot conversion layer.

The structures, materials, and related parameters of the first light modulation unit, the second light modulation unit, and the color conversion layer have been described in detail in the foregoing embodiments, and will not be described herein again.

When the light-emitting layer is formed, an organic light-emitting layer covering the whole driving substrate can be formed on the driving substrate by using an evaporation process, and the fine metal mask (FMM) is not needed, thereby reducing the cost and simplifying the process. In the forming the second color conversion unit and the third color conversion unit, a photoresist doped with the second color and the third color quantum dots may be spin-coated and then subjected to a photolithography process, or a glue with the second color quantum dot and a glue doped with the third color quantum dot may be adopted respectively by inkjet printing or imprinting method. The first light modulation unit and the second light modulation unit may be prepared by coating, deposition lithography or the like. The above processes are all mature processes in the art, which are well known to one skilled in the art and will not be described herein.

Based on the technical concept of the above-mentioned embodiments, an embodiment of the present disclosure further provides an OLED display device including the OLED display substrate provided in the above-mentioned embodiment. The OLED display device may be any of a display panel, a mobile phone, a tablet computer, a television, a notebook computer, a digital photo frame, a navigator, or any product or component having a display function.

The embodiments of the present disclosure provide an OLED display substrate, a method of preparing the same and a display device, in which the light modulation layer is configured to modulate an emergent direction of first color light by arranging a light modulation layer on the light-exiting path of the light-emitting layer, thereby effectively improving the viewing angle characteristic, eliminating the viewing angle color shift, and improving the display quality.

In the description of the present disclosure, it should be noted that the terms "middle", "up", "down", "front", "back", "vertical", "horizontal", "top", "bottom", "inside", "outside", etc. indicating the orientation or spatial relationship is based on the orientation or spatial relationship shown in the drawings, and are merely for the convenience of describing the present disclosure and the simplification of the description, rather than indicating or implying that the referred device or element must have a particular orientation, or be constructed and operated in a particular orientation. Thus, it should not be construed as a limitation on the present disclosure.

In the description of the embodiment of the present disclosure, it should be noted that, unless expressly stated or limited otherwise, the terms "mount", "connect" or "join" shall be interpreted broadly, and may be, for example, fixed connection, removable connection, or integral connection; may be a mechanical connection, may also be an electrical connection; may be direct connection, or may be indirect connection through an intermediary medium, and may be the internal communication of two components. The specific meanings of the above terms in the present disclosure can be understood by a person skilled in the art on a case-by-case basis.

The embodiments disclosed in the present disclosure are as described above, but they are merely used to facilitate the understanding of the embodiments of the present disclosure, and are not intended to limit the embodiments of the present disclosure. Any modification and variation in the form and details of the present disclosure may be made by one skilled in the art without departing from the spirit and scope of the present disclosure. The scope of patent protection is still subject to the scope defined by the appended claims.

What is claimed is:

1. An organic light-emitting diode display substrate, comprising a light-emitting layer, a light modulation layer, and a color conversion layer, wherein the light-emitting layer is configured to emit a first color light, the light modulation layer and the color conversion layer are arranged on different light-exiting paths of the light-emitting layer, the color conversion layer is configured to convert the first color light into a second color light and a third color light, and the light modulation layer is configured to modulate an emergent direction of the first color light, wherein the light-emitting layer comprises a first light-emitting unit, a second light-emitting unit, and a third light-emitting unit that are periodically arranged on a driving substrate and emit the first color light, the light modulation layer comprises a first light modulation unit and a second light modulation unit that are arranged on a light-exiting path of the first light-emitting unit and modulate the emergent direction of the first color light, and the color conversion layer comprises a second color conversion unit that is arranged on a light-exiting path of the second light-emitting unit and converts the first color light into the second color light and a third color conversion unit that is arranged on a light-exiting path of the third light-emitting unit and converts the first color light into the third color light, wherein a viewing angle characteristic of the first color light emitted by the first light modulation unit is configured to be the same as viewing angle characteristics of the second color light and the third color light emitted respectively by the second color conversion unit and the third color conversion unit, and wherein the second light modulation unit is configured to scatter light and to improve color purity of the first color light.

2. The organic light-emitting diode display substrate of claim 1, wherein the first light modulation unit, the second color conversion unit, and the third color conversion unit are arranged on a protective layer covering the light-emitting layer, and wherein an orthogonal projection of the first light modulation unit on the driving substrate at least partially overlaps with an orthogonal projection of the first light-emitting unit on the driving substrate, an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate.

3. The organic light-emitting diode display substrate of claim 1, wherein the second color conversion unit and the third color conversion unit are arranged on a protective layer covering the light-emitting layer, and wherein an orthogonal projection of the second color conversion unit on the driving substrate at least partially overlaps with an orthogonal projection of the second light-emitting unit on the driving substrate, an orthogonal projection of the third color conversion unit on the driving substrate at least partially overlaps with an orthogonal projection of the third light-emitting unit on the driving substrate, the second light modulation unit is arranged on an overcoat covering the second color conversion unit and the third color conversion unit, and an orthogonal projection of the second light modulation unit on the driving substrate at least partially overlaps with an orthogonal projection of the first light-emitting unit on the driving substrate.

4. The organic light-emitting diode display substrate of claim 1, wherein the first light modulation unit, the second color conversion unit, and the third color conversion unit are arranged on a cover plate, and wherein an orthogonal projection of the first light modulation unit on the driving substrate at least partially overlaps with an orthogonal projection of the first light-emitting unit on the driving substrate, an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate.

5. The organic light-emitting diode display substrate of claim 1, further comprising a second filter unit and a third filter unit arranged on light-exiting paths of the second color conversion unit and the third color conversion unit, respectively.

6. The organic light-emitting diode display substrate of claim 1, wherein the first light modulation unit is a single layer structure comprising a matrix layer and microparticles distributed in the matrix layer, a refractive index of the matrix layer being different from a refractive index of the microparticles.

7. The organic light-emitting diode display substrate of claim 6, wherein the matrix layer has a thickness of 1 μm to 50 μm, the microparticles have an equivalent diameter of 0.025 μm to 5 μm, and a volume ratio of the microparticles to the matrix layer is 1:20 to 1:1.25.

8. The organic light-emitting diode display substrate of claim 1, wherein the first light modulation unit is a laminated structure comprising 2 to 5 modulation layers that are stacked sequentially, each of the modulation layers comprising a matrix layer and microparticles distributed in the matrix layer, a refractive index of the matrix layer being different from a refractive index of the microparticles.

9. The organic light-emitting diode display substrate of claim 1, wherein the first light-emitting unit, the second light-emitting unit, and the third light-emitting unit each comprise a first electrode, an organic material functional layer, and a second electrode, one of the first electrode and the second electrode is a reflective electrode and the other is a transflective electrode, and the organic material functional layers of the first light-emitting unit, the second light-emitting unit, and the third light-emitting unit are an integrated structure.

10. The organic light-emitting diode display substrate of claim 9, wherein the reflective electrode comprises a reflective layer and a transmissive layer that are stacked, a material of the transflective electrode comprises an elementary substance of a metal element or an alloy thereof, and a thickness of the transflective electrode is 8 nm to 20 nm.

11. The organic light-emitting diode display substrate of claim 1, wherein first color light is blue light, and the color conversion layer is a quantum dot conversion layer.

12. A display device comprising the organic light-emitting diode display substrate of claim 1.

13. A method of preparing the organic light-emitting diode display substrate of claim 1, comprising:
forming a light-emitting layer for emitting first color light; and
forming a light modulation layer and a color conversion layer on different light-exiting paths of the light-emitting layer, wherein the color conversion layer is configured to convert first color light into second color light and third color light, and the light modulation layer is configured to modulate an emergent direction of first color light.

14. The method of claim 13, wherein:
the forming the light-emitting layer for emitting first color light comprises forming a first light-emitting unit, a second light-emitting unit, and a third light-emitting unit that are periodically arranged on a driving substrate and emit first color light;
the forming the light modulation layer and the color conversion layer comprises:
forming a protective layer on the light-emitting layer; and
forming a first light modulation unit, a second color conversion unit, and a third color conversion unit on the protective layer, wherein an orthogonal projection of the first light modulation unit on the driving substrate at least partially overlaps with an orthogonal projection of the first light-emitting unit on the driving substrate, an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate.

15. The method of claim 14, wherein the first light modulation unit is a single layer structure comprising a matrix layer and microparticles distributed in the matrix layer, a refractive index of the matrix layer being different from a refractive index of the microparticles.

16. The method of claim 14, wherein the first light modulation unit is a laminated structure comprising 2 to 5 modulation layers that are stacked sequentially, each of the modulation layers comprising a matrix layer and microparticles distributed in the matrix layer, a refractive index of the matrix layer being different from a refractive index of the microparticles; the matrix layer has a thickness of 1 µm to 50 µm, the microparticles have an equivalent diameter of 0.025 µm to 5 µm, and a volume ratio of the microparticles to the matrix layer is 1:20 to 1:1.25.

17. The method of claim 13, wherein:
the forming the light-emitting layer for emitting first color light comprises forming a first light-emitting unit, a second light-emitting unit, and a third light-emitting unit that are periodically arranged on a driving substrate and emit first color light;
the forming the light modulation layer and the color conversion layer comprises:
forming a protective layer on the light-emitting layer;
forming a second color conversion unit and a third color conversion unit on the protective layer, wherein an orthogonal projection of the second color conversion unit on the driving substrate at least partially overlaps with an orthogonal projection of the second light-emitting unit on the driving substrate, and an orthogonal projection of the third color conversion unit on the driving substrate at least partially overlaps with an orthogonal projection of the third light-emitting unit on the driving substrate;
forming an overcoat covering the second color conversion unit and the third color conversion unit; and
forming a second light modulation unit on the overcoat, wherein an orthogonal projection of the second light modulation unit on the driving substrate at least partially overlaps with an orthogonal projection of the first light-emitting unit on the driving substrate.

18. The method of claim 13, wherein:
the forming the light-emitting layer for emitting first color light comprises forming a first light-emitting unit, a second light-emitting unit, and a third light-emitting unit that are periodically arranged on a driving substrate and emit first color light to form the light-emitting substrate;
the forming the light modulation layer and the color conversion layer comprises:
forming a light modulation layer and a color conversion layer on a cover plate to form a light processing substrate; and
oppositely arranging the light-emitting substrate and the light processing substrate.

* * * * *